United States Patent
Nakamura et al.

[11] Patent Number: 6,154,511
[45] Date of Patent: *Nov. 28, 2000

[54] CLOCK EXTRACTION CIRCUIT

[75] Inventors: Satoshi Nakamura; Akio Tajima, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/928,179

[22] Filed: Sep. 12, 1997

[30] Foreign Application Priority Data

Sep. 13, 1996 [JP] Japan ................................. 8-265182
Jan. 17, 1997 [JP] Japan ................................. 9-019823

[51] Int. Cl.[7] ..................................................... H03D 3/24
[52] U.S. Cl. .......................................... 375/375; 375/376
[58] Field of Search ................................... 375/376, 374, 375/373; 331/17, 1 A; 455/260

[56] References Cited

U.S. PATENT DOCUMENTS

| | | | |
|---|---|---|---|
| 4,114,710 | 9/1978 | Katoh et al. ............................... | 178/67 |
| 4,164,758 | 8/1979 | Kowal ....................................... | 358/167 |
| 4,357,943 | 11/1982 | Thompson et al. ..................... | 128/419 |
| 4,663,844 | 5/1987 | Flora et al. .............................. | 307/455 |
| 5,394,107 | 2/1995 | Shou et al. ............................... | 327/354 |
| 5,506,531 | 4/1996 | Jang et al. ............................... | 327/156 |
| 5,635,875 | 6/1997 | Kusakabe ................................ | 331/1 A |

FOREIGN PATENT DOCUMENTS 63-7050  1/1988  Japan.

OTHER PUBLICATIONS

IEEE J. of Solid–State Circuits Vo.29(12) Dec. 1994, pp. 1572–1576.
Digest of Technical Papers; 1994 International Solid–State Circuits Conference, pp. 110–111.
IEEE 1995 Custom Integrated Circuits Conference, pp. 99–102.

Primary Examiner—Stephen Chin
Assistant Examiner—Dac V. Ha
Attorney, Agent, or Firm—Scully, Scott, Murphy & Presser

[57] ABSTRACT

A clock extraction circuit which is simplified in structure, improved in transmission efficiency, amenable to integration and size reduction and not limited by the operating speed of a phase comparator. An input signal frequency-divided by m and extracted clock signals outputted by a voltage-controlled oscillator and frequency-divided by n are phase-compared and an absolute value of the output of the phase comparator is taken by an absolute value circuit. An output of the absolute value circuit is passed through a low-pass filter to control the voltage-controlled oscillator for constituting the clock extraction circuit.

10 Claims, 15 Drawing Sheets

1 EDC EDGE DETECTING CIRCUIT
2 FDiv FREQUENCY DIVIDER, FIRST
3 P.C PHASE COMPARATOR
4 AVC ABSOLUTE VALUE CIRCUIT
5 LPF LOW PASS FILTER
6 VCO VOLTAGE-CONTROLLED-OSCILLATOR
7 FDiv FREQUENCY DIVIDER, SECOND

1 EDC EDGE DETECTING CIRCUIT
2 FDiv FREQUENCY DIVIDER, FIRST
3 P.C PHASE COMPARATOR
4 AVC ABSOLUTE VALUE CIRCUIT
5 LPF LOW PASS FILTER
6 VCO VOLTAGE-CONTROLLED-OSCILLATOR

1 EDC EDGE DETECTING CIRCUIT
2 FDiv FREQUENCY DIVIDER, FIRST
3 P.C PHASE COMPARATOR
4 AVC ABSOLUTE VALUE CIRCUIT
5 LPF LOW PASS FILTER
6 VCO VOLTAGE-CONTROLLED-OSCILLATOR
7 FDiv FREQUENCY DIVIDER, SECOND

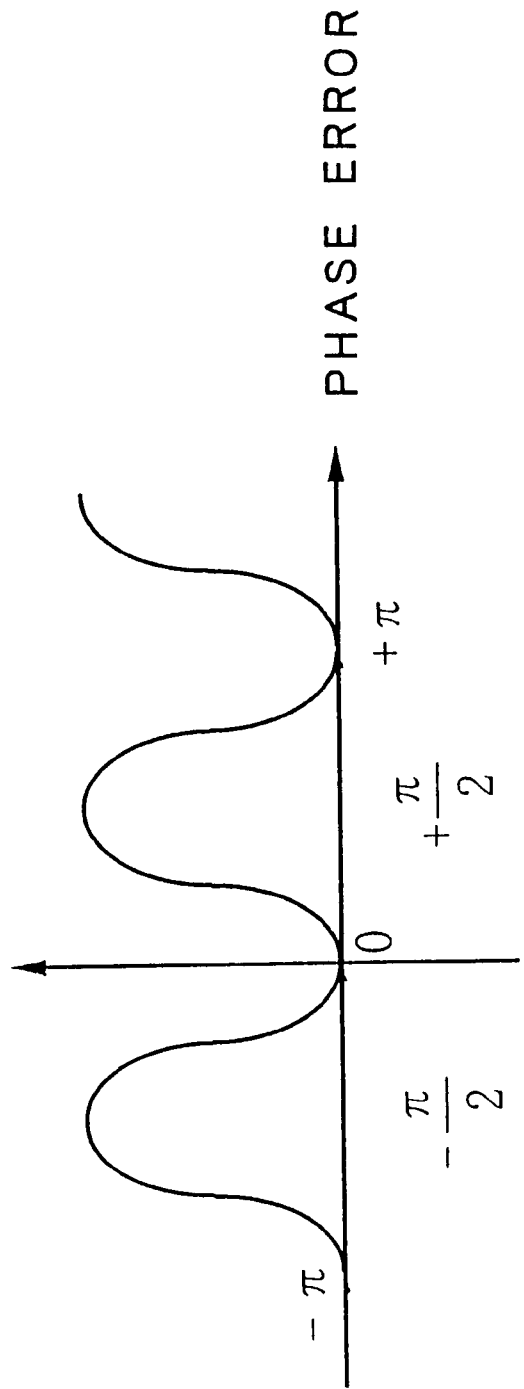
FIG. 4(c) ABSOLUTE VALUE CIRCUIT OUTPUT
DETECTED BY BOTH EDGES OF CLOCK (INVENTION)

A  4Gb/s NRZ SIGNAL DATA(01101101 1...)
B  NRZ SIGNAL DIVIDED BY 2
C  EXRACTED CLK DIVIDED BY 2
D  EXTRACTED 4GHzCLK

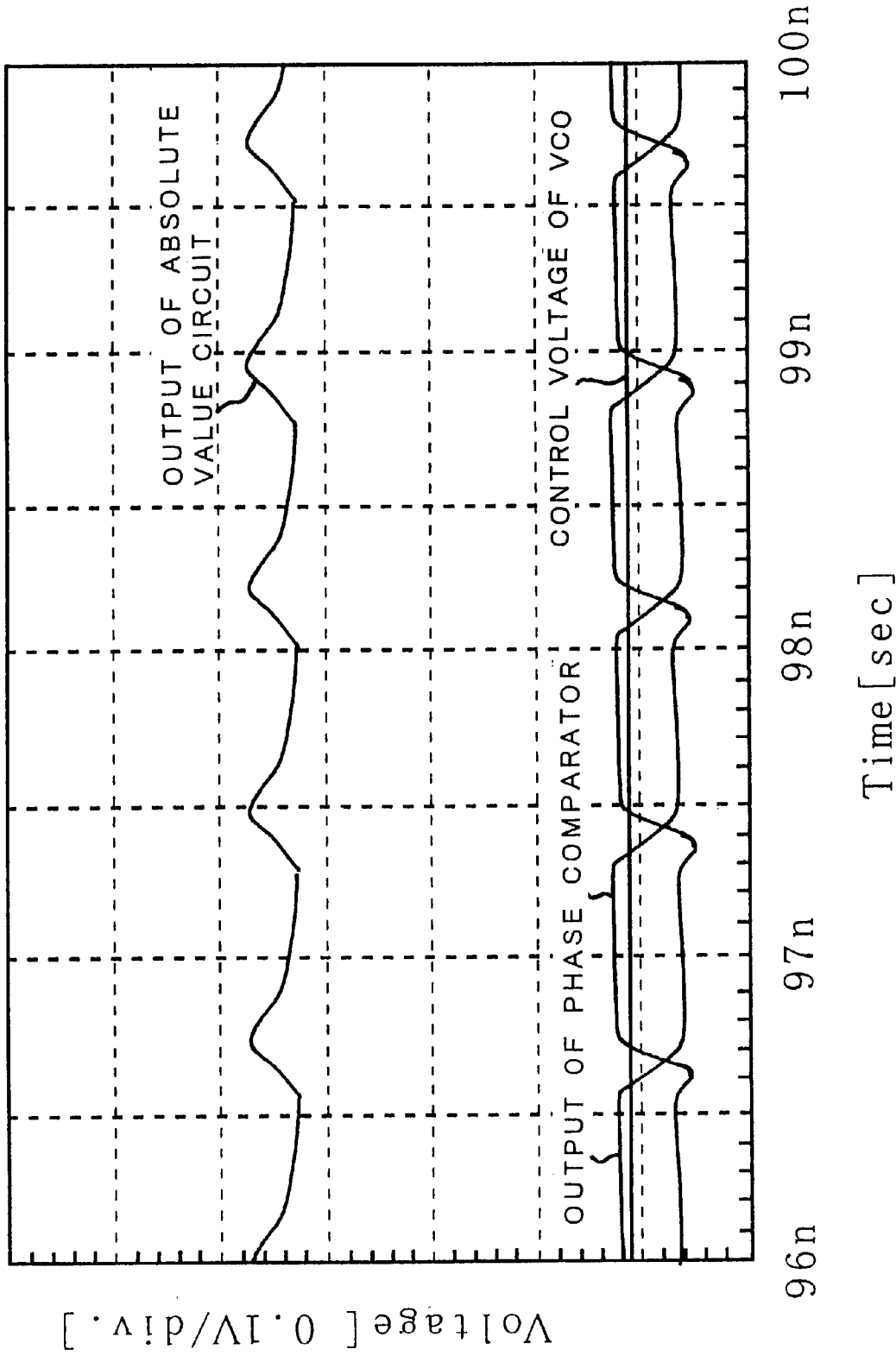

1 EDC EDGE DETECTING CIRCUIT
3 P.C PHASE COMPARATOR
5 LPF LOW PASS FILTER
6 VCO VOLTAGE-CONTROLLED-OSCILLATOR

CLOCK EXTRACTION CIRCUIT

TECHNICAL FIELD OF THE INVENTION

This invent ion relates to a clock extraction circuit extracting clocks from an input signal. More particularly, it relates to a clock extraction circuit in which timing clock signals are extracted from a non-return-to-zero signal used in the field of light communication and supplied to a discrimination reproducing unit designed for data reproduction

BACKGROUND OF THE INVENTION

In high-speed digital communication with a data transmission speed of 1 [Gb/s] or more for transmitting time division multiplexed data and receiving the transmitted data with time separation (demultiplexing), a receiver is in need of a clock corresponding to the transmission rate for discrimination and time separation of received data. Since clock components are extracted from high-speed data prior to time separation and the clocks thus extracted are used for discrimination and time separation, a clock extraction circuit operating at a high speed is required, which greatly depends on device characteristics. If the data transfer speed exceeds 1 Gb/s, for example, a high-speed phase comparator can hardly be realized.

FIG. 12 shows a block diagram showing the structure of a conventional clock extraction circuit. In this figure, the conventional clock extraction circuit includes an edge detection circuit 1 detecting a point of transition of a non-return-to-zero (NRZ) signal entered at an input terminal 11, and a phase comparator 3 for phase comparison between the NRZ signal received and an output signal of a voltage controlled oscillator (VCO) 6 by receiving the output of the edge detection circuit 1 at its one input terminal and the output of the VCO 6 at its other terminal. The conventional clock extraction circuit also includes a low-pass filter 5 for outputting only pre-set low frequency range signals of an output of the phase comparator 3, and VCO 6 oscillating pulse signals depending on an output signal (signal voltage) outputted by the low-pass filter 5 for outputting pulse signals to an output terminal 12 and to the other input terminal of the phase comparator 3.

SUMMARY OF THE DISCLOSURE

In the above-described conventional clock extraction circuit, it is exclusively the phase comparator 3 that determines the limitation of the speed with which the clock extraction circuit can stably operate. That is, for receiving the NRZ signal of the transmission speed of f[b/s], it is thought that the phase comparator 3 needs to be in operation at a frequency of f[Hz].

However, there is a limitation to the operating speed of the commercially available phase comparator, such that very few phase comparators can be stably operated at the desired high velocity.

Thus, with a receiver provided with the conventional clock extraction circuit, limitations are imposed on the information transmitting speed of the entire communication system because of limitations of the operating speed of the phase comparator.

Although a phase comparator capable of a high-speed operation is available, it is expensive and large in size, such that it cannot meet the demand of the market for low cost and size of the device.

As a timing clock extraction circuit, there is proposed in JP Patent Kokai JP-A-63-7050 such a timing clock extraction circuit having a first frequency divider for frequency-dividing an output of a voltage controlled oscillator to a frequency range substantially equal to the transmission speed of the input signal and a second frequency divider for frequency-dividing the output of the frequency divider to one-half, with the output of the second frequency divider being supplied to the phase comparator. However, if used for detecting the NRZ signal, the structure of JP-A-63-7050 gives an incorrect phase difference value as will be explained subsequently.

In view of the above-mentioned problems inherent in the clock extraction circuit of the prior art, it is a principal object of the present invention to provide a novel clock extraction circuit of a high operating speed which, while simplifying the structure and improving the transmission efficiency, lends itself to integration and size reduction and is not limited by the operating speed of the phase comparator.

Naturally the present invention also aims at a method or system for obtaining an improved clock extraction.

Further objects will become apparent in the entire disclosure.

According to an aspect of the present invention there is provided a novel clock extraction circuit for receiving non-return-to-zero signals for signal regeneration. The clock extraction circuit is characterized in that a signal obtained on frequency-dividing received non-return-to-zero signals by m, where m is a pre-set integer, and a signal obtained on frequency-dividing a signal oscillated by a voltage-controlled oscillator at a frequency substantially equal to a transmission rate of the received non-return-to-zero signals by n, where n is a pre-set integer, are phase-compared to each other to extract synchronized clock signals.

According to another aspect of the present invention, the clock extraction circuit also includes an edge detection circuit, for detecting transition points of an output of a non-return-to-zero signal frequency-divided by m, a voltage-controlled oscillator generating clock signals in a frequency range substantially equal to a transmission rate of the received non-return-to-zero signals, a frequency divider circuit frequency-dividing the clock signals generated by the voltage-controlled oscillator by n, and a phase comparator phase-comparing the non-return-to-zero signals frequency-divided by m and the clock signals frequency-divided by n by means of the edge pulses detected by the edge detection circuit and the clock signals frequency-divided by n by the frequency divider, and an absolute value circuit outputting an absolute value of an output of the phase comparator.

The present invention will be briefly explained in the following. The present invention includes a frequency divider for frequency-dividing an input signal by m, and an edge detection circuit detecting transition points of the input signal frequency-divided by m for generating pulses. There is a phase comparator for receiving an output of the edge detection circuit in its one input, and an absolute value circuit receiving an output of the phase comparator for outputting a value proportionate to an absolute value of the phase comparator output. Also there are provided : a low-pass filter for receiving an output of the absolute value circuit, a voltage-controlled oscillator (VCO) controlled by an output of the low-pass filter and a frequency divider for frequency-dividing an output signal of the VCO by n. An output of the frequency divider is connected to the other input of the phase comparator while timing clocks are extracted from an output of the voltage-controlled oscillator. This evades generation of detection errors of the phase difference at the time of extraction of timing clocks from the non-return-to-zero (NRZ) signals.

The meritorious effect of the present invention will be briefly mentioned.

As described above, the present invention has a meritorious effect that a high-speed clock extraction circuit can be realized even with the use of a phase comparator of an operating speed nearly as high as the customary operating speed at most.

The reason is that, in the present invention, the operating speed of the phase comparator of, for example, half of the transmission speed of the data input signal is thought to be sufficient, thus enabling high-speed clock extraction. According to the present invention, high-speed clock extraction for data signals up to the transmission rate twice the conventional rate is possible with the use of the same phase comparator as that used in the conventional system.

Moreover, with the present invention, since the high-speed clock extraction circuit can be formed on a chip, the high-speed clock extraction circuit can be reduced in size and cost as compared to the conventional circuit.

BRIEF DESCRIPTION OF THE DRAWINGS

FIG. 3(a) shows input NRZ signals, FIG. 3(b) shows detection pulses generated responsive to transition points of the NRZ signals, FIG. 3(c) shows extracted clock signals, FIG. 3(d) shows the waveform of frequency-divided extracted clock signals and FIG. 3(e) shows the waveform produced when the frequency-divided extracted clocks are phase-shifted by $\pi$ at the time of synchronization.

FIGS. 4(a) to 4(c) show output characteristics of a phase comparator relative to the phase error, where FIG. 4(a) shows output characteristics of a prior-art phase comparator as a comparative example, FIG. 4(b) shows output characteristics of an embodiment of the present invention and FIG. 4(c) shows output characteristics of an absolute value circuit of an embodiment of the present invention.

FIGS. 11(a) and 11(b) show the result of simulation conducted on the second embodiment of the present invention, wherein FIG. 11(a) shows waveforms in which 4 [GHz] clock signals are extracted from the 4 [Gb/s] input data waveform, and FIG. 11(b) shows output waveforms of various parts in the circuit.

PREFERRED EMBODIMENTS OF THE INVENTION

Figure 1:
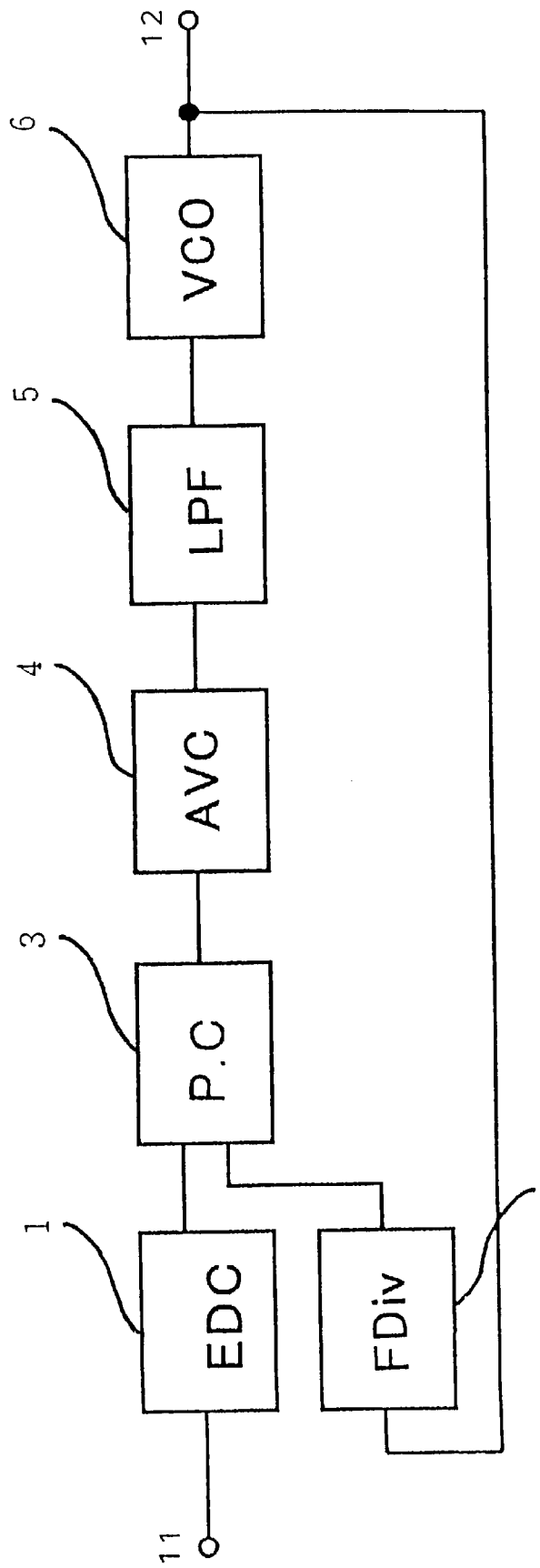
FIG. 1 is a block diagram showing the structure of a first embodiment of the present invention.

Referring to the drawings, preferred embodiments of the present invention will be explained in detail.

FIG. 1 is a block circuit showing the structure of a clock extraction circuit according to a first embodiment of the present invention. Referring to FIG. 1, a clock extraction circuit of the first embodiment is made up of an edge detection circuit 1, a frequency divider 2, a phase comparator 3, an absolute value circuit 4, a low-pass filter 5 and a voltage-controlled oscillator (VCO) 6.

An input data signal entered to an input terminal 11 has its transition points detected by the edge detection circuit 1 so that detection pulses corresponding to the transition points are outputted. The extracted clock signals from the VCO 6 are frequency-divided by the frequency divider 2 and the resulting detected pulses and the extracted clock signals frequency-divided by the frequency divider 2 are entered to the phase comparator 3 where the input data signals and the frequency-divided clock signals are phase-compared to produce an output signal corresponding to the phase difference. This output signal corresponding to the phase difference is entered to the absolute value circuit 4.

If, upon phase-comparing the input data signal and the frequency-divided clock signals from the VCO 6, the phase error information of a signal obtained by frequency-dividing clock signals outputted by the VCO 6 is desired to be obtained by the edge pulses obtained on detecting the transition points of the input signal from the rising and falling edges (or flanks) of the input data signal, as in the prior-art technique, there is a risk that an output opposite in sign to the correct signal be produced even if the phase error is of the same magnitude.

Figure 3:
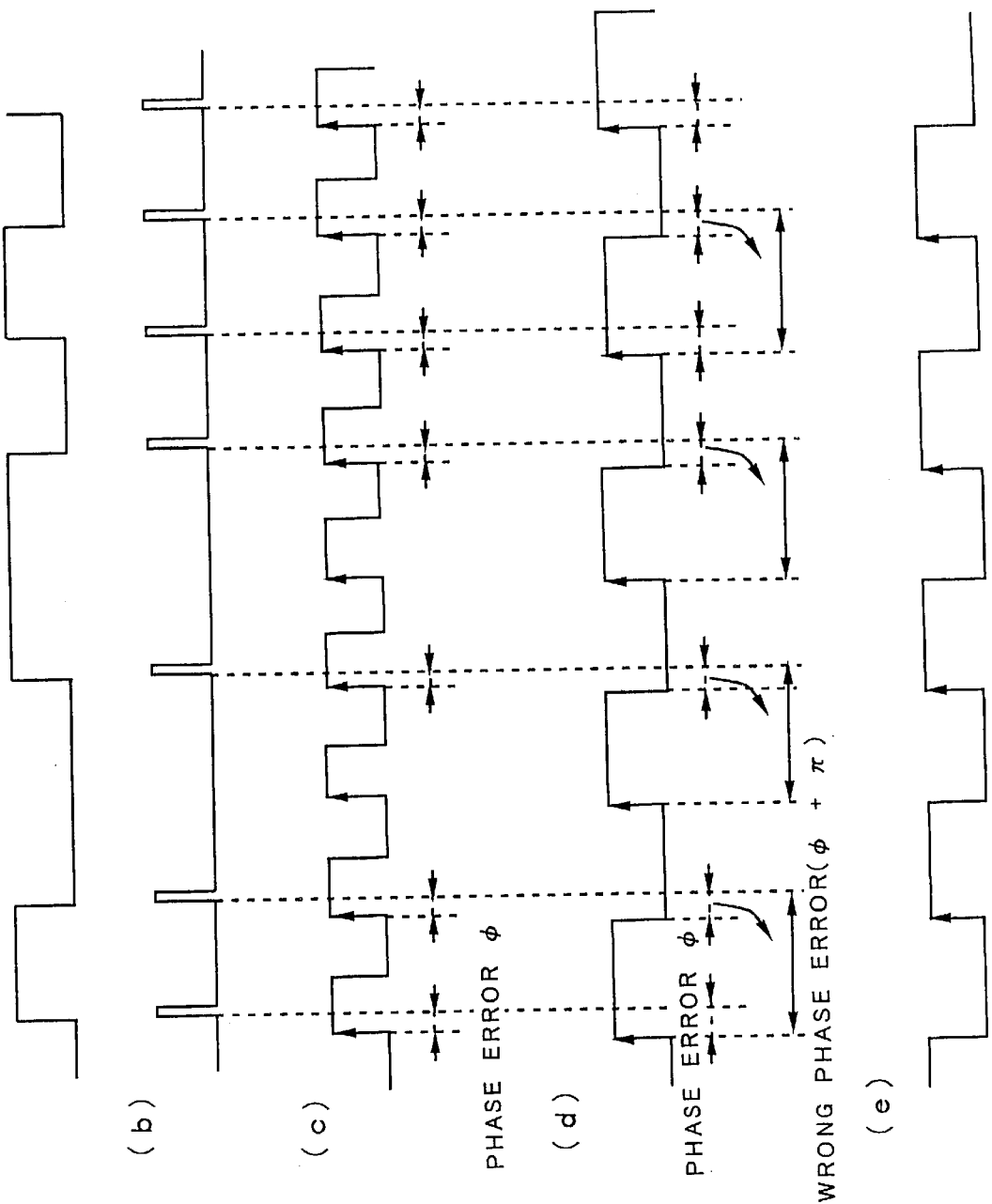
FIGS. 3(a) to 3(e) are timing charts for illustrating the operation of the embodiments of the present invention, where

This is shown in FIG. 3, of which FIG. 3(a) shows a signal waveform of an input data signal, FIG. 3(b) shows a signal waveform of edge pulses generated by detecting the rising and falling edges of the input data signal and FIG. 3(c) shows a signal waveform of a clock signal outputted by the VCO 6 (extracted clock signal). FIG. 3(d) shows a signal waveform of an output clock signal of the VCO 6 frequency-divided by the frequency divider 2.

In the conventional system, a phase error between the extracted clock signal of FIG. 3(c) and the input data of FIG. 3(a) is detected by the edge pulse of FIG. 3(b). The rising of the edge pulse and that of the clock signals are compared to each other by the phase comparator 3 and a value corresponding to the phase error is outputted. FIG. 3(c) shows how the phase error $\phi$ is being detected.

However, if the phase error is detected in the frequency-divided state of the extracted clock signal according to the conventional system, the phase error is compared between the rising edge of the edge pulse (FIG. 3(b)) and the rising edge of the frequency-divided clock signal (FIG. 3(d)) because the phase comparator compares the phase between two rising edges. In this case, unfortunately, the phase error relative to a falling edge a half period ahead is occasionally detected which is counted for a wrong phase error. In order to achieve a true comparison, the comparison should be performed also with the falling edge of the frequency divided clock signal (FIG. 3(d)). Therefore, according to the conventional system, the risk is high that the incorrect phase error information be outputted as a phase error information. FIG. 3(d) shows that, if the phase error is detected at a timing corresponding to any of the falling edges of the frequency-divided clock signals, an incorrect value of the phase error φ+π is outputted in place of the actual phase error φ.

Such error cannot be predicted at all because the input signal is a random signal.

Figure 4A:
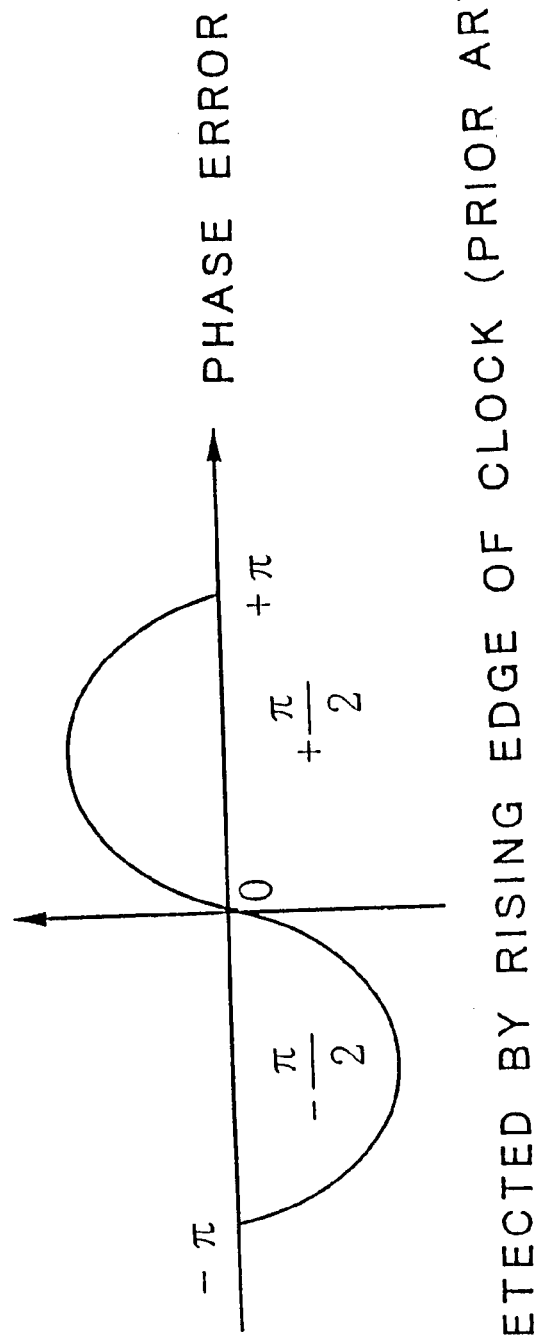
Figure 4B:
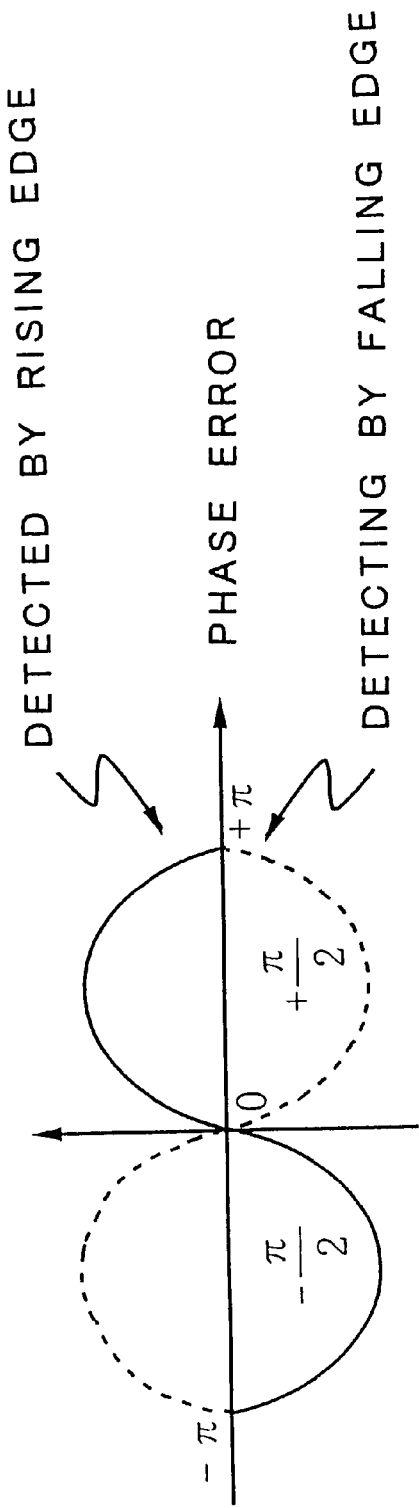

FIG. 4(a) shows, as a comparative example according to the prior art, the relation between the output and the phase error in case the phase error is detected by the phase comparator 3 with respect to the rising edge of the extracted clock, in accordance with the conventional technique, while FIG. 4(b) shows, as a comparative example of the present invention, the relation between the output and the phase error in case the phase error is detected by the phase comparator with respect to both the rising edge and the falling edge of the extracted clock.

FIG. 4(c) shows the relation between the output and the phase error of the absolute value circuit associated with the phase comparator output of FIG. 4(b).

In the conventional system, an output associated with the phase error can be unequivocally obtained for a range of from $-\pi/2$ to $\pi/2$ of the phase error, as shown in FIG. 4(a). However, in FIG. 4(b), the same value of the phase error leads to a positive output value or a negative output value depending on whether the edge of the detecting clock is a rising edge or a falling edge.

In the embodiment of the present invention, an unequivocal output can be obtained for the phase error as in the prior art by taking an absolute value of the output of the phase comparator thus enabling synchronization.

Here, there is a configuration such that an unequivocal output associated with the phase error is obtained for the range of 0 to $+\pi/2$ and for the range of $\pi$ to $+3\pi/2$ of the phase error.

However, according to this embodiment, a case may happen where synchronization may be applied not only if the phase error of the frequency-divided clock with respect to the input data is equal to 0 but also if the clock is phase-delayed by $+\pi$ relative to the input data.

This state is shown in FIG. 3(e). In this case, no problem is raised because the phase delay of the frequency-divided clock equal to $+\pi$ about the extracted clock prior to frequency division corresponds to the phase delay of $+2\pi$ about the original extracted clock.

Turning again to FIG. 1, an output signal of the absolute value circuit 4 is entered to the low-pass filter 5 where it is freed of unneeded high frequency components before being outputted from the low-pass filter 5. The VCO 6 has its oscillation frequency controlled by an output of the low-pass filter 5 for phase synchronization so that the clock signal f[Hz] outputted by the VCO 6 will be equal to the data transfer rate f[b/s] of the input data signal. The extracted clock is outputted to outside at the output terminal 12.

For more detailed explanation of the embodiment of the present invention, an example of the present invention will be now explained.

Figure 5:
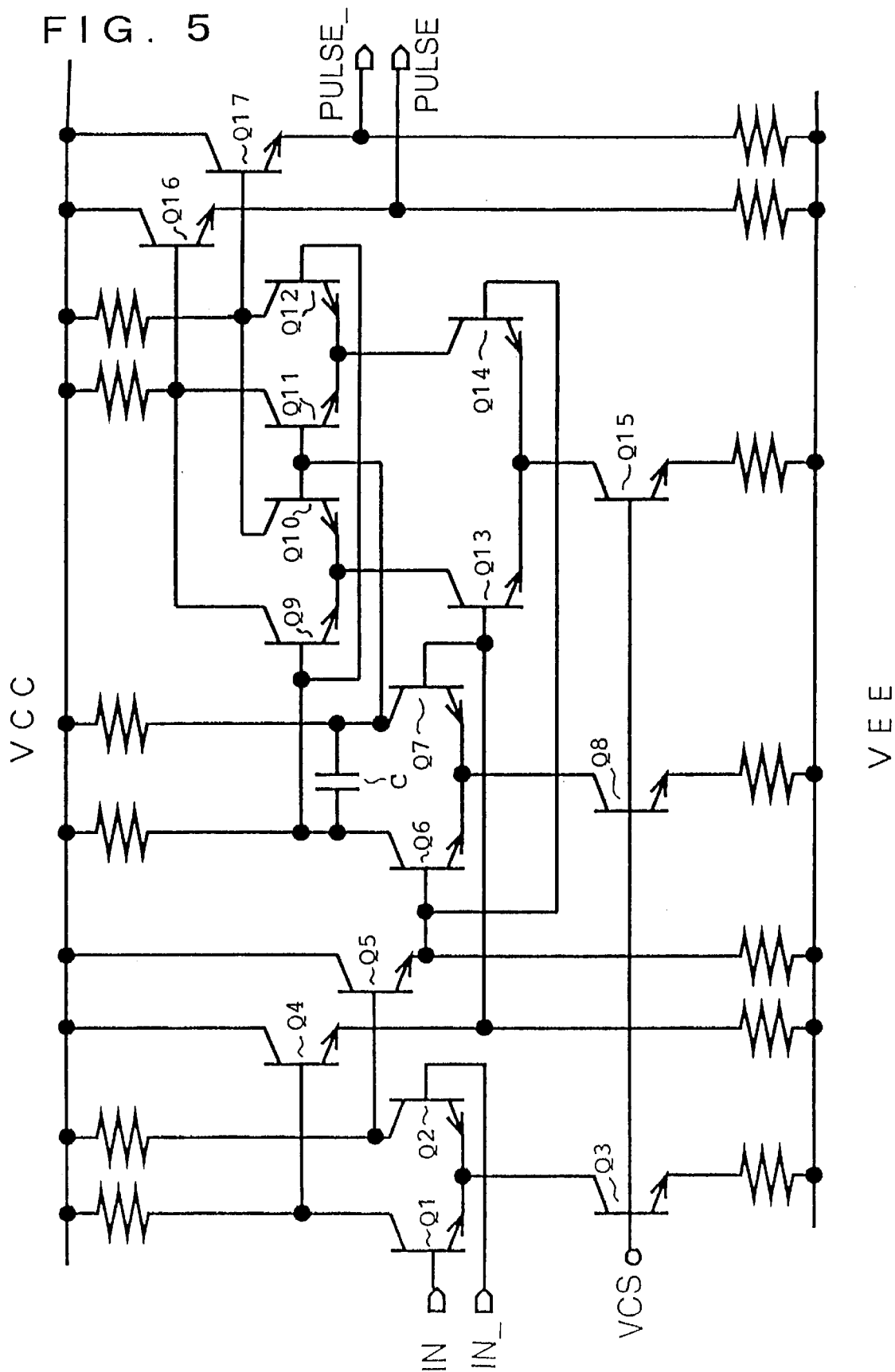
FIG. 5 shows a circuit structure illustrating a typical edge detection circuit of an embodiment of the present invention.

FIG. 5 shows an example of an illustrative circuit structure of an edge detection circuit 1. Referring to FIG. 5, the edge detection circuit 1 includes first differential transistor pair Q1, Q2, having complementary input signals IN and IN__ as inputs, a constant current source transistor Q3 for this first differential transistor pair and a pair of emitter follower transistors Q4 and Q5 having outputs of the first differential transistor pair as an input. The edge detection circuit 1 also includes a differential amplifier including a second differential transistor pair Q6, Q7 having an output of the emitter follower as an input and having its collector outputs connected together via a capacitor C. The edge detection circuit 1 also includes a third differential transistor pair Q9, Q10 and a fourth differential transistor pair Q11, Q12 having outputs of the differential amplifier as differential inputs and having outputs connected to emitter follower transistors Q16, Q17. The edge detection circuit 1 further includes a fifth differential transistor pair Q13, C14 connected to common emitters of the third and fourth differential transistor pairs and having outputs of the emitter follower transistor Q4, Q5 as base inputs, and transistors Q8, Q15 supplying the constant current to the common emitters of the second and fifth differential transistor pairs.

The third and fourth differential transistor pairs and the fifth differential transistor pair make up an exclusive OR circuit, such that, if the differential input signals entered to the third differential transistor pairs Q9, Q10 are A, A__ and the differential input signals entered to the fifth differential transistor pairs Q13, Q14 are B, B__, EXOR(A, B), EXOR (A__, B__) are entered to the bases of the transistors Q16, Q17. The signals A, A__ are entered to the third and fourth differential transistor pairs as signals delayed from output signals B, B__ of the emitter follower transistors Q4, Q5 by a time constant defined by the capacitance C of the second differential transistor pairs Q6, Q7 and the load resistance, while outputs PULSE, PULSE__ are issued as signals having pulse widths corresponding to the delay time at the time of transition of the input signals IN, IN__.

Figure 6:
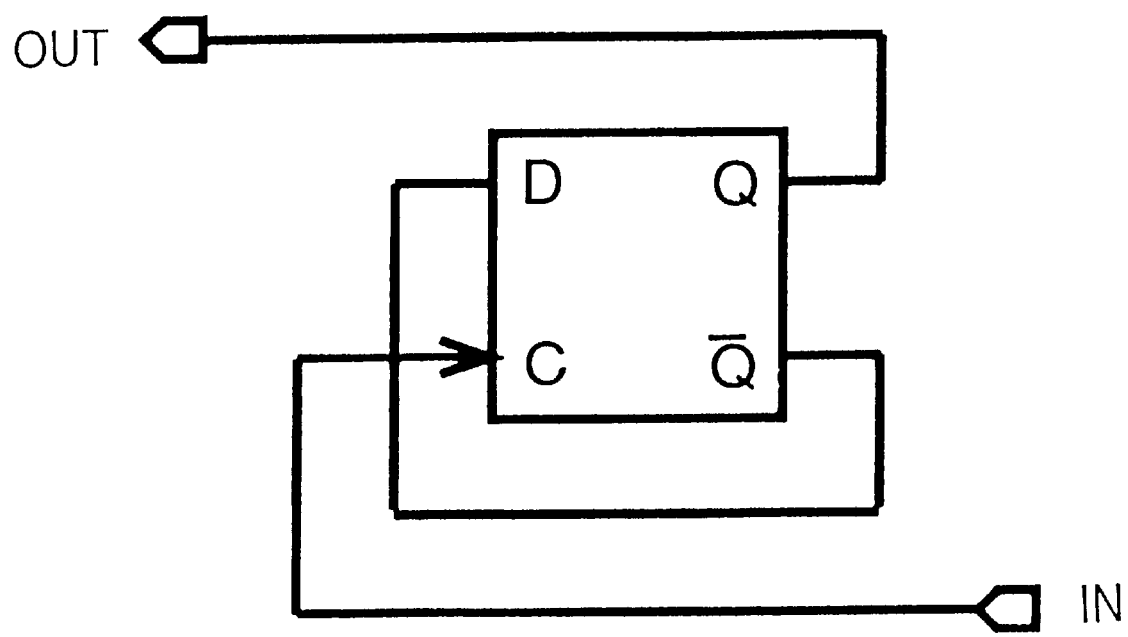
FIG. 6 shows a circuit structure illustrating a typical frequency divider of an embodiment of the present invention.

FIG. 6 shows an example of an illustrative circuit structure of a frequency divider. The frequency divider has an inverting output Q__ of a D-flipflop fed back to an input terminal D, with a signal of a frequency equal to half the frequency of an input IN.

Figure 7:
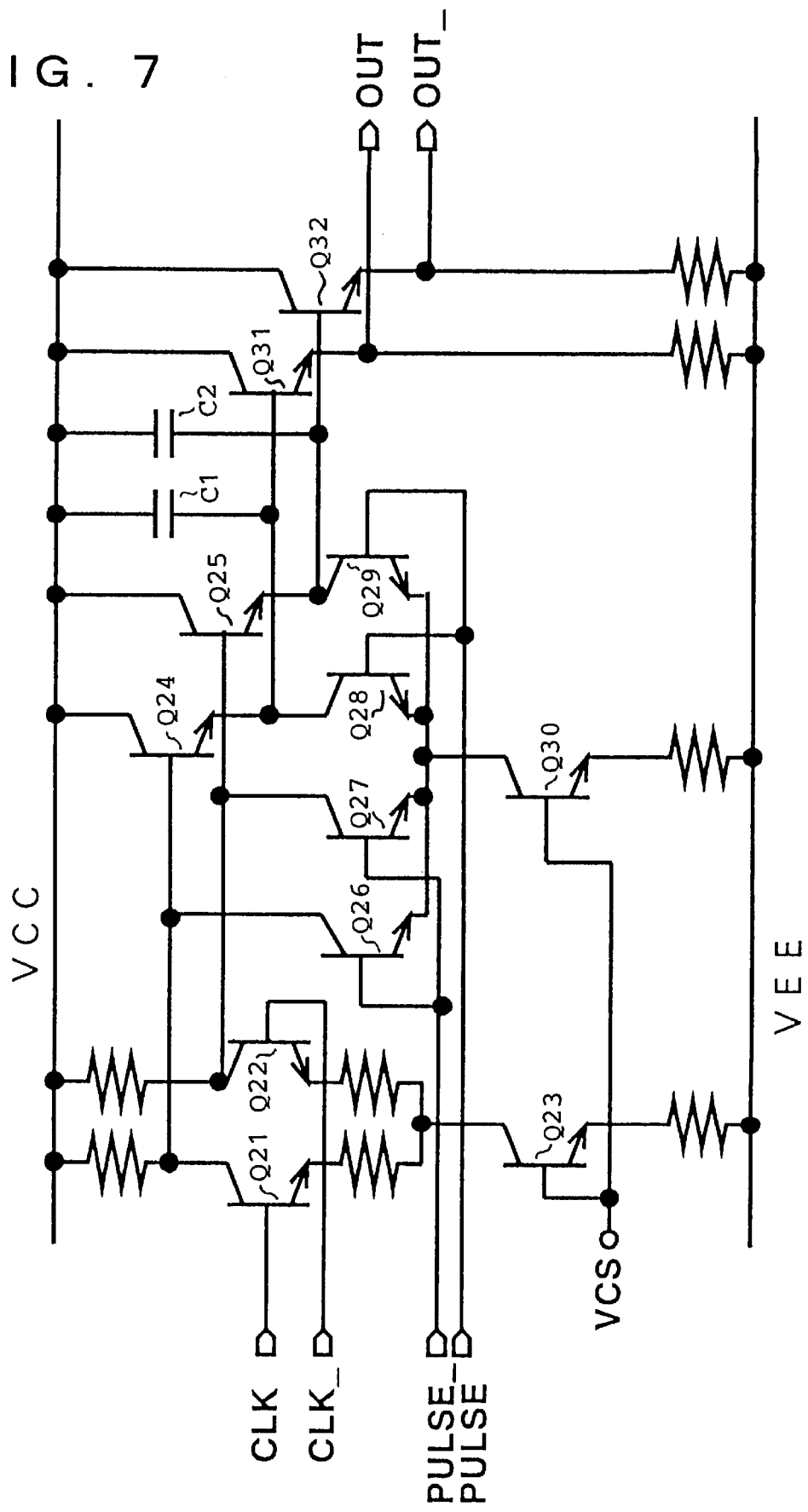
FIG. 7 shows a circuit structure illustrating a typical phase comparator of an embodiment of the present invention.

FIG. 7 shows an example of an illustrative circuit structure of the phase comparator. Referring to FIG. 7, the phase comparator includes differential pair (emitter-coupled pair) transistors Q21, Q22 having CLK, CLK__ as inputs and transistors Q26, Q27, Q28 and Q29 having emitters connected in common and connected to a constant current source transistor Q30. The collectors of the transistors Q26, Q27 are connected to outputs of the differential pair transistors Q21, Q22, while the collectors of the transistors Q28, Q29 are connected to emitters of level-shifting transistors Q24, Q25 having outputs of the differential pair transistors Q21, Q22 as inputs. The transistors Q26, Q27 have the negative-phase PULSE__ signal as a base input, while the transistors Q28, Q29 have the positive-phase PULSE signal as a base input. The collectors of the transistors Q28, Q29 are connected via holding capacitors C1, C2 to a voltage source VCC and are connected to output stage emitter follower transistors Q31, Q32 as inputs. Although FIG. 7 shows a structure of a sample-and-hold type comparator circuit, the phase comparator of the present invention is naturally not limited to this specified construction.

The operation of the phase comparator circuit shown in FIG. 7 will be explained briefly. If the signal PULSE is of a High level, the signal PULSE__ goes Low to turn on the transistors Q28, Q29 (with the transistors Q26, Q27 being turned off). The transistors Q31, Q32 receive voltages corresponding to outputs of the differential pair transistors Q21, Q22 minus base-to-emitter voltages VBE of the transistors Q24, Q25, respectively. The differential pair transistors Q21, Q22 receive the signals CLK, CLK__, such as sinusoidal high-speed signal waveform, as inputs. The input voltages to the transistors Q31, Q32 are sampled by capacitors C1, C2.

On the other hand, if the signal PULSE is of a Low level, the transistors Q28, Q29 are turned off, while the transistors Q24, Q25 are turned off to hold the sampled voltage values in capacitors C1, C2. Thus, the sample-held values of OUT, OUT_ are outputted.

Figure 8:
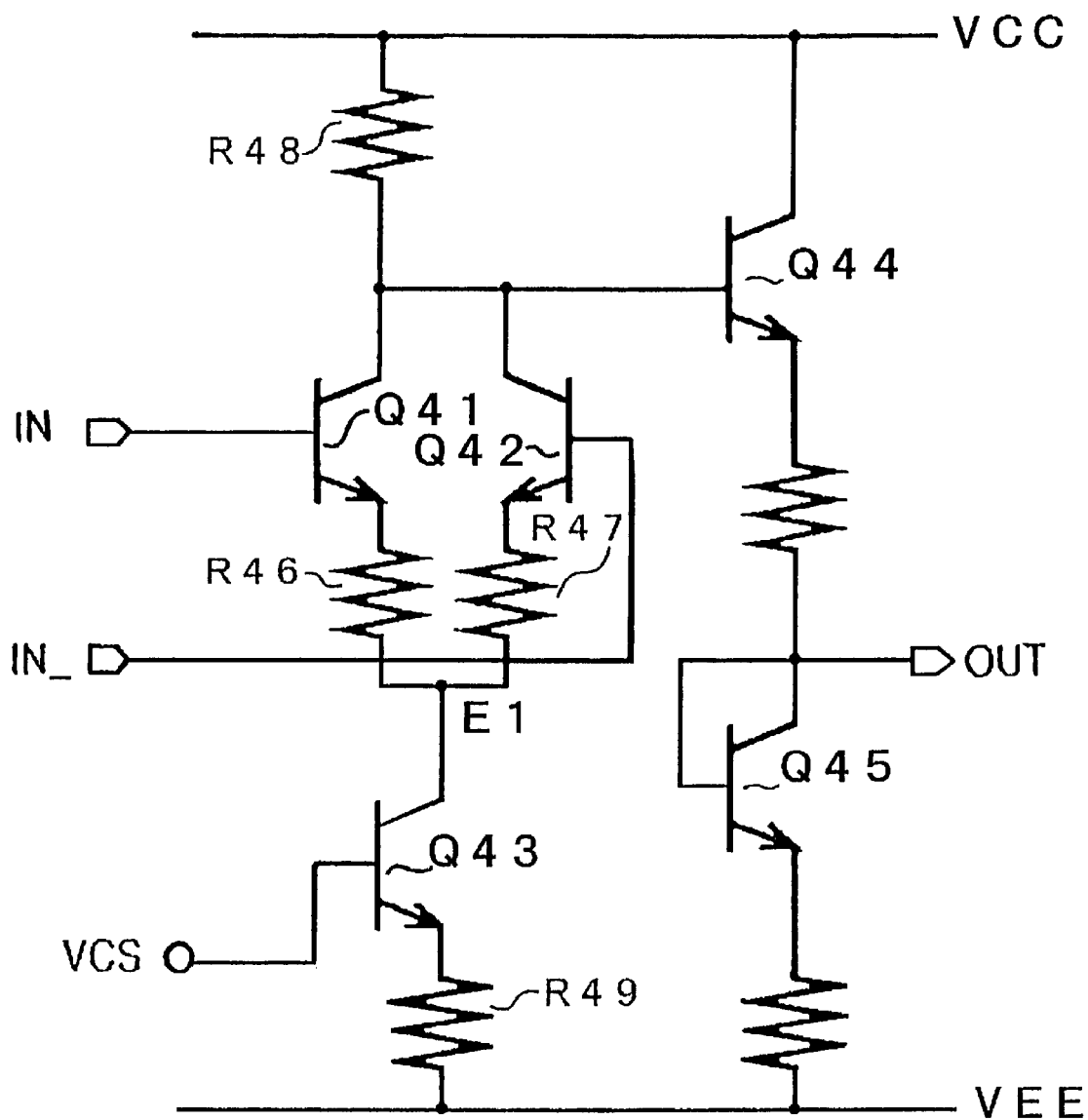
FIG. 8 shows a circuit structure illustrating a typical absolute value circuit of an embodiment of the present invention.

As the absolute value circuit, any known circuit may be used. In addition, a circuit structure as shown for example in FIG. 8 may be used. Referring to FIG. 8, the absolute value circuit includes differential pair transistors Q41, Q42 having differential input signals IN, IN_ as inputs to base terminals, and an emitter follower transistor Q44. A transistor Q43 operates as a variable current source for the differential pair transistors Q41, Q42, while a transistor Q45 operates as a level shifting circuit for adjusting the output level of the emitter follower circuit. The collectors of the differential pair transistors Q41, Q42 are connected in common and connected to a high side voltage source VCC via resistor R48, while the common connecting point of ihe collectors of the differential pair transistors Q41, Q42 is connected to the base of the transistor Q44 of the emitter follower circuit configuration. The emitters of the differential pair transistors Q41, Q42 are connected to each of one ends of resistors R46, R47, the opposite ends of which are connected in common at node E1 and connected to the collector of the transistor Q43, the emitter of which is connected via resistor R49 to a low side voltage source VEE.

Referring to FIG. 8, the operation of the absolute value circuit will be explained in detail. In the present example, the complementary signals IN, IN_ outputted by the phase comparator of the previous stage are of extremely low voltage level, with the transistor Q43 operating in saturation, when, with the potential of IN higher than the potential IN_, the input IN is gradually lowered from the high level, the node E1, as a junction between the opposite ends of resistors R46, R47, the one ends of which are connected to the emitters of the differential pair transistors Q41, Q42, and the other end to the collector of the transistor Q43, is pulled down from the potential of IN via a built-in voltage across the base and the emitter of the transistor Q41, as a result of which the voltage VCE across the emitter and the collector of the transistor Q43 is decreased.

Since the transistor Q43 is operating in saturation, and a constant source voltage VCS is applied across its base, the current flowing in the transistor Q43 is decreased gradually with decrease in the IN potential and, in response thereto, the emitter follower output OUT is increased gradually.

If, in case with the IN potential is lower than the IN_ potential, the input IN is further decreased to a LOW level, the IN_ potential is increased accordingly. This pulls up the potential at the node E1 via the built-in voltage across the base and the emitter of the transistor Q42, as a result of which the emitter-to-collector voltage VCE of the transistor Q43 is increased. Since the transistor Q43 is operating in saturation, and a constant source voltage VCS is applied across its base, the current flowing in the transistor Q43 is increased gradually with increased IN_ potential, that is with further lowering of the IN potential and, in response thereto, the emitter follower output OUT is decreased gradually.

Thus it is seen that the absolute value circuit shown in FIG. 8 outputs an absolute value between the inputs IN and IN_, that is a value proportionate to |IN-IN_|.

Figure 9:
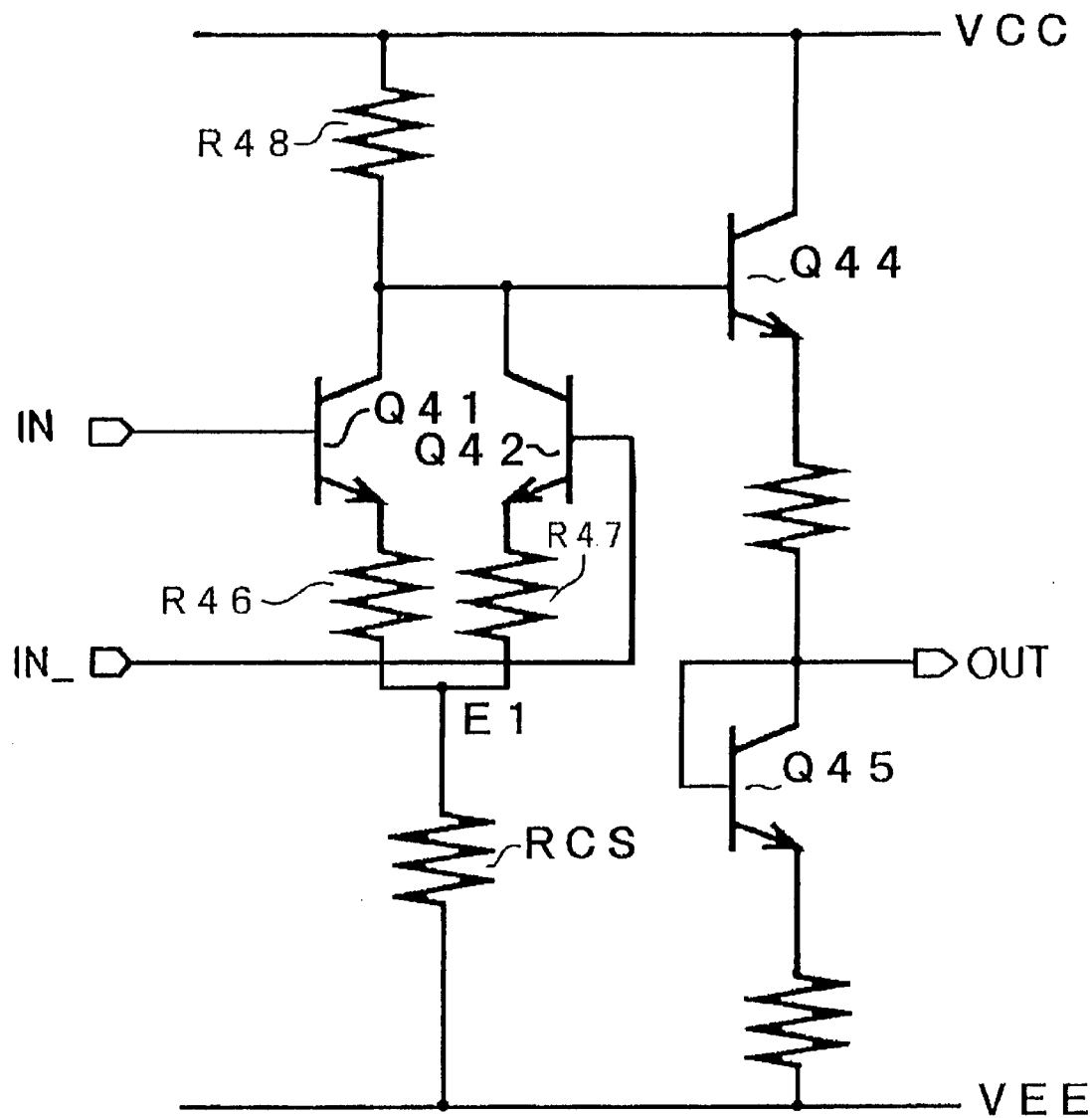
FIG. 9 shows a circuit structure illustrating another typical absolute value circuit of an embodiment of the present invention.

FIG. 9 shows a further example of the absolute value circuit which differs from the circuit of FIG. 8 in substituting a resistor element RCS for the bipolar transistor Q43. The resistors R46, R47, having one ends connected to emitters of the differential pair transistors Q41, Q42, have the other ends thereof connected in conmmon and connected at the node E1 to one end of the resistor RCS, the opposite end of which is connected to the low side source VEE.

Since the inputs IN, IN_ are complementary differential inputs, if, even with the configuration shown in FIG. 9, the input IN is gradually lowered from the High level, with the potential of IN being higher than the potential of IN_, the collector current flowing through the transistor Q41 is gradually decreased and, in response thereto, the output OUT is gradually increased.

If, with the potential IN being lower than the potential IN_, the input IN is further lowered to the Low level, the collector current flowing through the transistor Q42 is gradually increased and, in response thereto, the output OUT is gradually decreased. Thus it is seen that, similarly to the circuit configuration shown in FIG. 8, the absolute value circuit shown in FIG. 9 outputs a value proportionate to the absolute value between the inputs IN and IN_, that is a value proportionate to |IN-IN_|.

Figure 10:
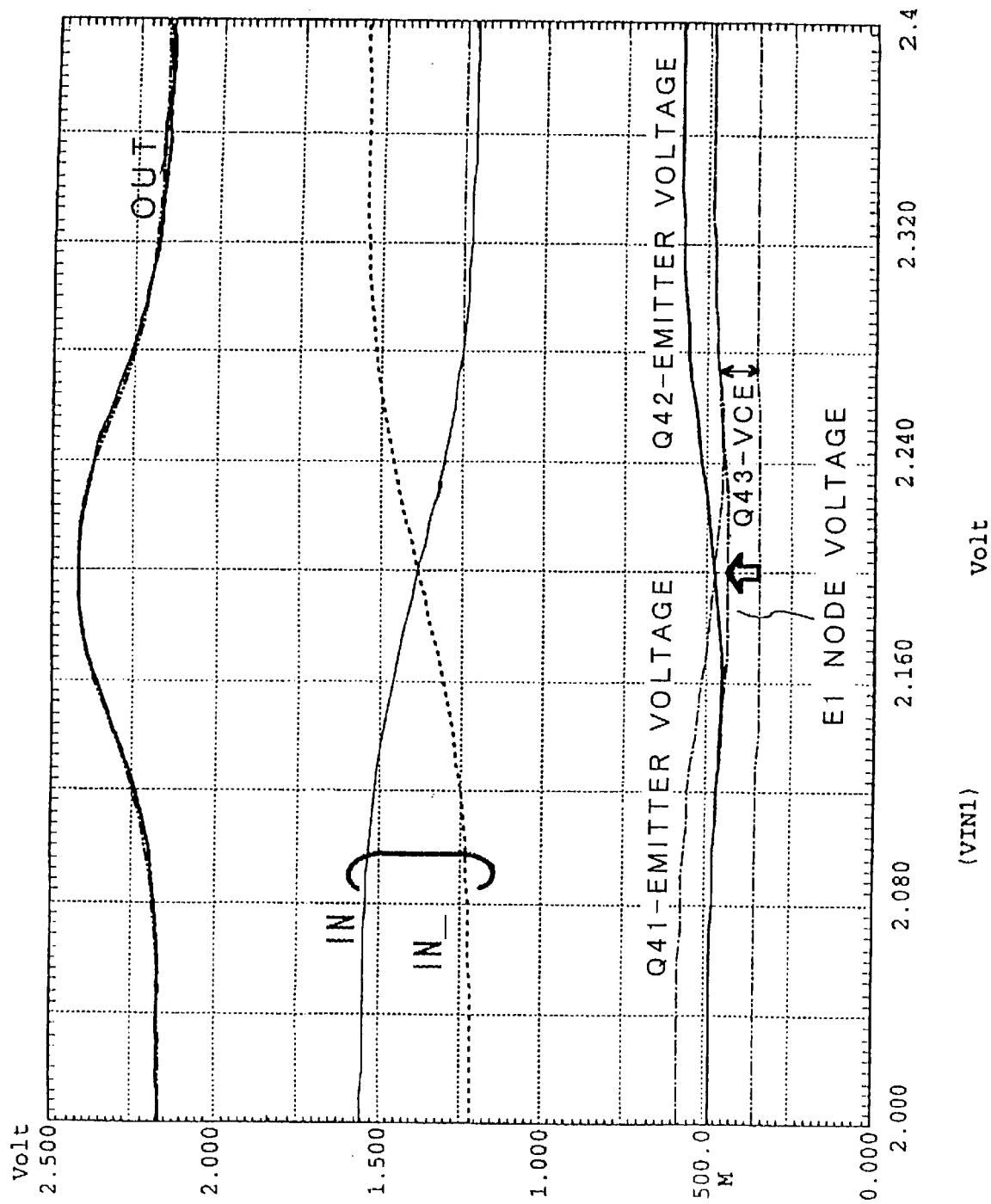
FIG. 10 shows the results of simulation illustrating dc characteristics of the absolute value circuit shown in FIG. 8.

FIG. 10 shows the results of simulation of the absolute value circuit shown in FIG. 8. It can be seen that the output OUT outputs a value proportionate to |IN-IN_| responsive to value of inputs IN and IN_.

Although the absolute value circuit constituted by a bipolar transistor is shown in FIGS. 8 and 9, the bipolar transistor may also be replaced by the MOS transistor, in which case the transistors Q41 to Q45 are constituted by, for example, n-channel MOS transistors.

Figure 2:
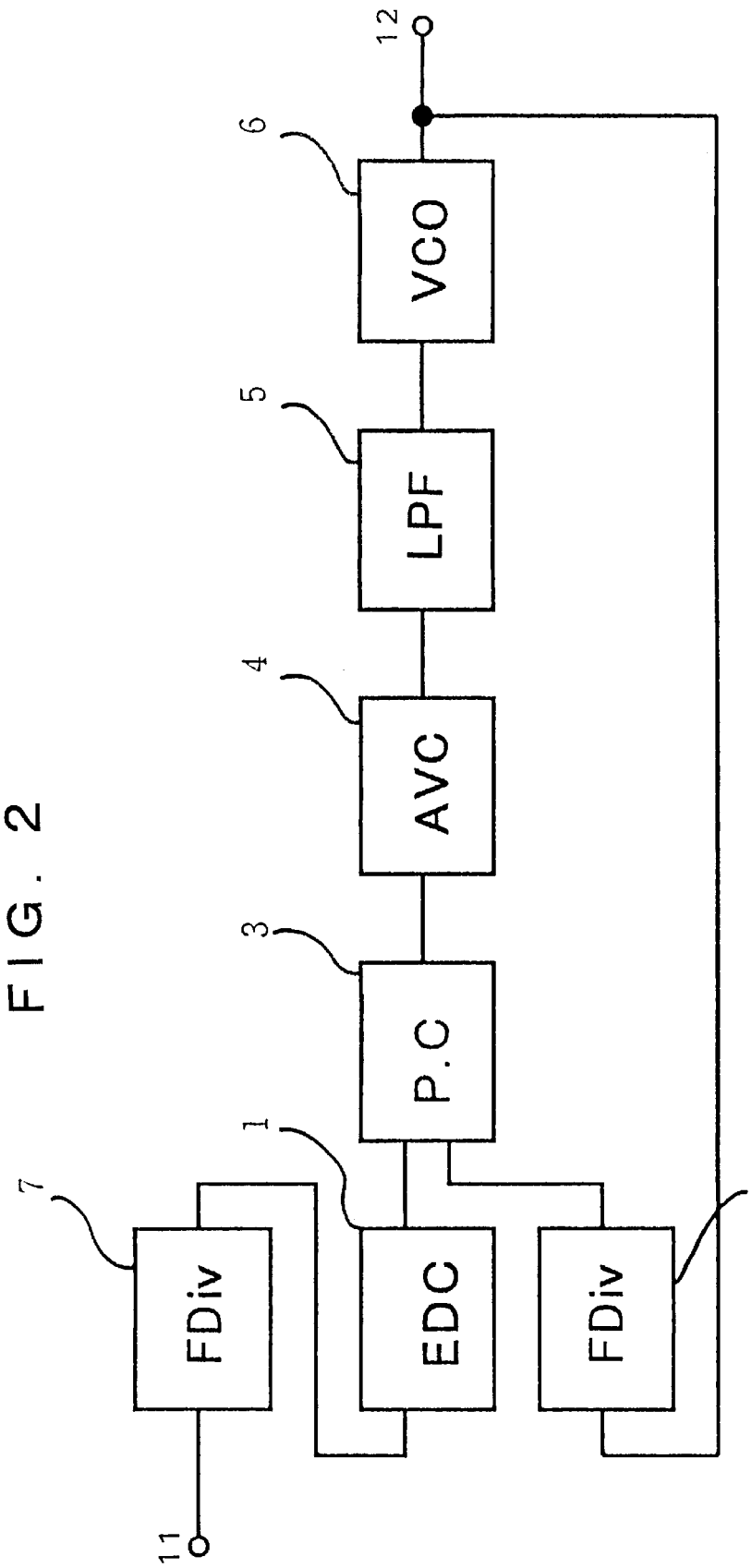
FIG. 2 is a block diagram showing the structure of a second embodiment of the present invention.

Referring to the drawings, a second embodiment of the present invention will be explained in detail. FIG. 2 shows a block circuit diagram illustrating the structure of a clock extraction circuit of the second embodiment of the present invention.

Referring to FIG. 2, the clock extraction circuit of the second embodiment is made up of a first frequency divider FDiv 2, an edge detection circuit EDC 1, a second frequency divider FDiv 7, a phase comparator PC 3, an absolute value circuit AVC 4, a low-pass filter LPF 5 and a VCO 6.

An input data signal entering the input terminal 11 is frequency-divided by the second frequency divider 7. The frequency-divided input data enters the edge detection circuit 1 where its transition point is detected and a detection pulse corresponding to the transition point is outputted.

The extracted clock signal of the VCO 6 is frequency-divided by the first frequency divider 2.

The detection pulse and the frequency-divided extracted clock signal are entered to the phase comparator 3 where the frequency-divided input digital signal and the frequency-divided clock signal are phase-compared and a signal corresponding to the phase error is sent to the absolute value circuit 4.

The extracted clocks are outputted to outside via output terminal 12. The configuration of the present second embodiment is similar to that of the first embodiment except that the input data frequency-divided by the second frequency divider 7 are subsequently entered to the edge detection circuit 1 instead of being directly entered to the edge detection circuit 1.

In the present second embodiment, not only the extracted clock signal, but also the input data are frequency-divided, by the second frequency divider 7, and a detection pulse is generated based on the transition point of the frequency-divided input data.

The above detection pulse and the frequency-divided extracted clock signal are entered to the phase comparator 3 where the frequency-divided input data signal and the frequency-divided clock signal are phase-compared, and a signal representative of the phase error is sent to the absolute value circuit 4.

With the present second embodiment, since both the clock signal and the detection pulse entered to the phase comparator 3 are frequency-divided signals, the phase comparator 3 car be operated at a lower speed, so that phase comparison becomes more reliable even with a high transmission speed of the input digital signal.

Figure 11A:
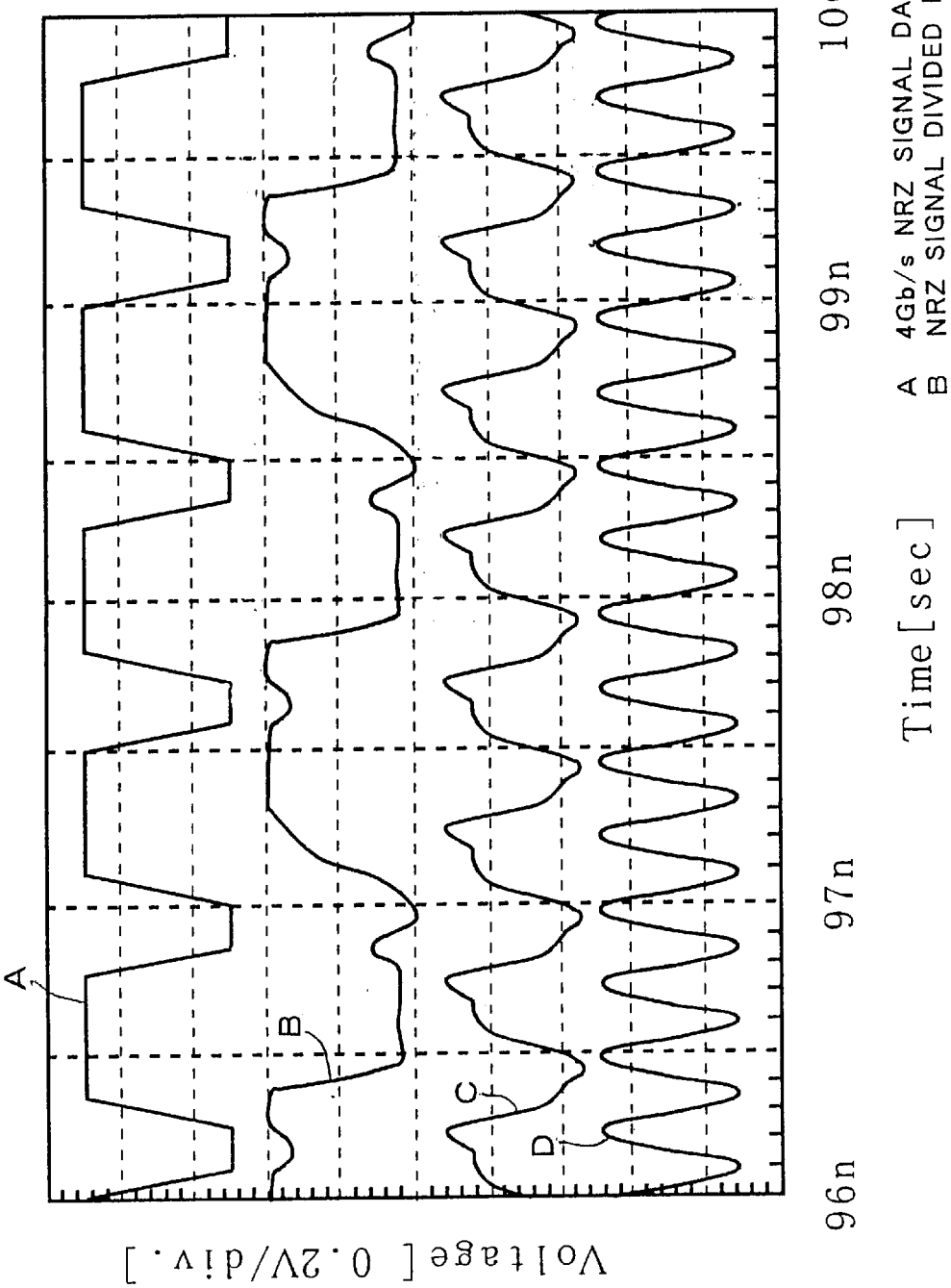
Figure 12:
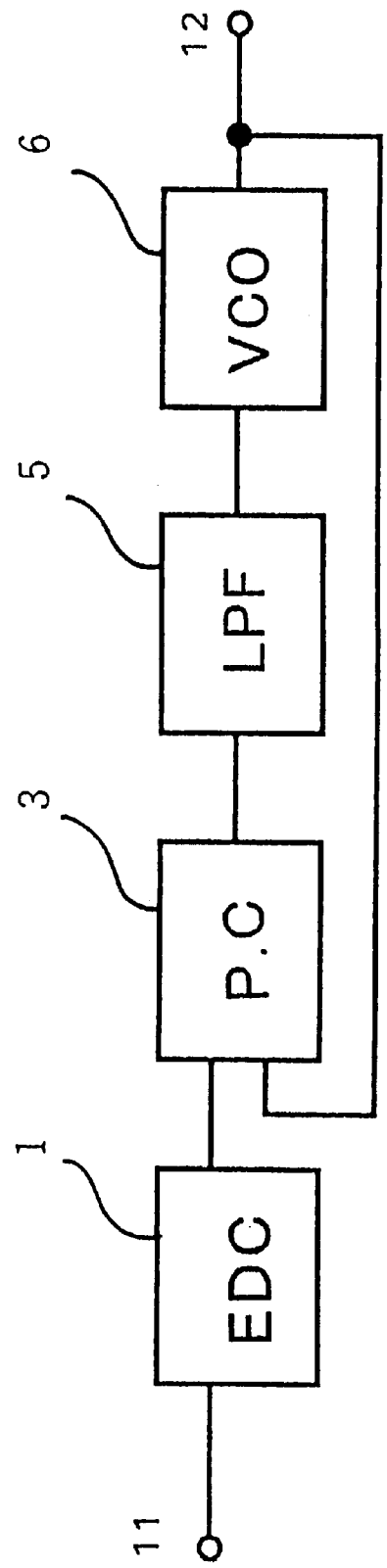
FIG. 12 is a block diagram showing the structure of the conventional technique

FIGS. 11(a), 11(b) illustrate, by way of an example of the present invention, the results of circuit simulation on the clock extraction circuit of the configuration of the second embodiment using model parameters of 0.25 μm BiCMOS.

FIG. 11(a) shows the manner in which clock signals of 4 [GHz] are being extracted for an input of repetition of a NRZ signal of "011011011. . ." of 4 [Gb/s].

FIG. 11(b) shows the waveform in the circuit and illustrates that an output of a phase comparator as a differential signal is passed through the absolute value circuit 4, an output absolute value of which is passed through the low-pass filter 5 to output a control output for the VCO 6.

In the present example, an edge of data at a transmission speed of 4 Gb/s is detected by the edge detection circuit 1, and an output of the VCO 6 having a control voltage of 0.8 to 1.5V and an oscillation frequency of 1.7 to 5.8 GHz is frequency-divided by the frequency divider 2 to produce 4 GHz clock signals.

It should be noted that modification apparent in the art may be made without departing the gist of the present invention disclosed herein within the scope as claimed.

What is claimed is:

1. A clock extraction method for receiving non-return-to-zero signals for signal regeneration wherein a signal obtained by frequency-dividing received non-return-to-zero signals by m, where m is a pre-set integer, and then detecting edges of the frequency-divided signal, and a signal obtained by frequency-dividing a signal generated by a voltage-controlled oscillator at a frequency substantially equal to a transmission rate of the received non-return-to zero signals by n, where n is a pre-set integer, are phase-compared to each other to produce a phase error signal to extract synchronized clock signals, and providing an absolute value of the phase error signal, wherein the signal obtained by frequency dividing the signal generated by the voltage-controlled oscillator produces a divided frequency signal wherein a falling edge of the divided frequency signal should sometimes be detected for a correct phase error, and providing an absolute value of the phase error signal compensates for the phase comparison with the divided frequency signal.

2. A clock extraction circuit comprising:

a first frequency divider circuit frequency-dividing received non-return-to-zero signals by a preset integer m;

an edge detection circuit detecting transition points of an output of said first frequency divider circuit and producing transition point output signals;

a voltage-controlled oscillator generating and outputting clock signal in a frequency range substantially equal to a transmission rate of the received non-return-to-zero signals;

a second frequency divider circuit frequency-dividing output clock signals of said voltage-controlled oscillator by a preset integer n;

a phase comparator phase-comparing the transition point output signals of said edge detection circuit and the clock signals frequency-divided by n by said second frequency divider circuit; and an absolute value circuit outputting an absolute value of an output of said phase comparator, wherein the second frequency divider circuit produces a divided frequency signal wherein a falling edge of the divided frequency signal should sometimes be detected for a correct phase error, and the absolute value circuit compensates for the phase comparison with the divided frequency signal.

3. The clock extraction circuit as defined in claim 2 wherein said absolute value circuit comprises:

differential pair transistors to which first and second differential input signals are supplied;

first signal terminals of said differential pair transistors being connected in common at a first junction and connected via a resistor to a first voltage source;

second signal terminals of said differential pair transistors being connected respectively by one end of a separate resistor, with the second ends of the separate resistors being connected in common at a second junction which is connected to a second source voltage via a resistor or via a transistor operating in saturation; and an output proportionate to an absolute value of a difference of said differential input signals is taken at the first junction of said first signal terminals of said differential pair transistors.

4. The clock extraction circuit as defined in claim 3 wherein said absolute value circuit comprises bipolar transistors or MOS transistors as said transistors.

5. A clock extraction circuit comprising:

an edge detection circuit detecting transition points of received non-return-to zero signals and producing transition point output signals;

a voltage-controlled oscillator generating and outputting clock signals in a frequency range substantially equal to the transmission rate of the received non-return-to-zero signals;

a frequency divider circuit frequency-dividing output clock signals of said voltage-controlled oscillator by a preset integer n;

a phase comparator phase-comparing the n-frequency-divided clock signals with the transition point output signals of the edge detection circuit; and an absolute value circuit outputting an absolute value of an output of said phase comparator, wherein the second frequency divider circuit produces a divided frequency signal wherein a falling edge of the divided frequency signal should sometimes be detected for a correct phase error, and the absolute value circuit compensates for the phase comparison with the divided frequency signal.

6. A clock extraction circuit comprising:

a first frequency divider circuit frequency-dividing received non-return-to-zero signals by 2;

an edge detection circuit detecting transition points of an output of said first frequency divider circuit and producing transition point output signals;

a voltage-controlled oscillator generating and outputting clock signal in a frequency range substantially equal to a transmission rate of the received non-return-to-zero signals;

a second frequency divider circuit frequency-dividing the clock signals generated by said voltage-controlled oscillator by 2;

a phase comparator phase-comparing the transition point output signals of the edge detection circuit and the frequency-divided clock signals divided by the second frequency divider circuit; and an absolute value circuit outputting an absolute value of an output of said phase comparator, wherein the frequency divider circuit produces a divided frequency signal wherein a falling edge of the divided frequency signal should sometimes be detected for a correct phase error, and the absolute value circuit compensates for the phase comparison with the divided frequency signal.

7. A clock extraction circuit comprising;

an edge detection circuit detecting transition points of received non-return-to-zero signals and producing transition point output signals;

a voltage-controlled oscillator generating and outputting clock signals in a frequency range substantially equal to a transmission rate of the received non-return-to-zero signals;

a frequency divider circuit frequency-dividing output clock signals of said voltage-controlled oscillator by 2;

a phase comparator phase-comparing the transition point output signals of said edge detection circuit and the frequency-divided clock signals divided by said frequency divider circuit; and an absolute value circuit outputting an absolute value of an output of said phase comparator, wherein the frequency divider circuit produces a divided frequency signal wherein a falling edge of the divided frequency signal should sometimes detected for a correct phase error, and the absolute value circuit compensates for the phase comparison with the divided frequency signal.

8. A clock extraction circuit comprising:

a first frequency divider circuit frequency-dividing received non-return-to-zero signals by a preset integer m;

an edge detection circuit detecting transition points of an output of said first frequency divider circuit and producing transition point output signals;

a voltage-controlled oscillator generating and outputting clock signals in a frequency range substantially equal to a transmission rate of the received non-return-to-zero signals;

a second frequency divider circuit frequency-dividing output clock signals of said voltage-controlled oscillator by a preset integer n;

a phase comparator phase-comparing the transition point output signals of said edge detection circuit and the clock signals frequency-divided by n said second frequency divider circuit:

an absolute value circuit outputting an absolute value of an output of said phase comparator;

wherein said absolute value circuit is formed so that one of complementary outputs of said phase comparator is entered to a base of a first bipolar transistor as one of complementary inputs;

the other of said complementary outputs of said phase comparator is entered to a base of a second bipolar transistor as the other of said complementary inputs;

an emitter of said first bipolar transistor is connected to an end of a first resistor;

an emitter of said second bipolar transistor is connected to an end of a second resistor;

the opposite end of said first resistor and the opposite end of said second resistor are connected to a collector of a third bipolar transistor;

a collector of said first bipolar transistor and a collector of said second bipolar transistor are connected to an end of a third resistor;

the opposite end of said third resistor is connected to a first source voltage;

an emitter of said third bipolar transistor is connected to an end of a fourth resistor, the opposite end of which is connected to a second source voltage;

a base of said third polar transistor is connected to a third source voltage; and collector terminals of said first and second bipolar transistors output a value proportionate to an absolute value of a difference between the one and the other of the complementary inputs in a state in which said third bipolar transistor operates in saturation.

9. A clock extraction circuit comprising:

a first frequency divider circuit frequency-dividing received non-return-to-zero signals by a preset integer m;

an edge detection circuit detecting transition points of an output of said first frequency divider circuit and producing transition point output signals;

a voltage-controlled oscillator generating and outputting clock signals in a frequency range substantially equal to a transmission rate of the received non-return-to-zero signals;

a second frequency divider circuit frequency-dividing output clock signals of said voltage-controlled oscillator by a preset integer n;

a phase comparator phase-comparing the transition point output signals of said edge detection circuit and the clock signals frequency-divided by n said second frequency divider circuit;

an absolute value circuit outputting an absolute value of an output of said phase comparator;

wherein said absolute value circuit is formed so that one of complementary outputs of said phase comparator is entered to a base of a first bipolar transistor as one of complementary inputs;

the other of said complementary outputs of said phase comparator is entered to a base of a second bipolar transistor as the other of said complementary inputs;

an emitter of said first bipolar transistor is connected to an end of a first resistor;

an emitter of said second bipolar transistor is connected to an end of a second resistor;

the opposite end of said first resistor and the opposite end of said second resistor are connected to an end of a third resistor;

a collector of said first bipolar transistor and a collector of said second bipolar transistor are connected to an end of a fourth resistor, the opposite end of which is connected to a first source voltage;

the opposite end of said third resistor is connected to a second source voltage; and collector terminals of said first and second bipolar transistors output a value proportionate to the absolute value of a difference between the one and the other complementary inputs.

10. A clock extraction circuit for receiving non-return-to-zero signals for signal regeneration comprising:

means for providing a first signal by frequency-dividing received non-return-to-zero signals by m, where m is a pre-set integer, means for detecting edges of the frequency-divided signals, means for providing a second signal by frequency-dividing a signal generated by a voltage-controlled oscillator at a frequency substantially equal to a transmission rate of the received non-return-to-zero signals by n, where n is a pre-set integer;

phase comparator means for phase-comparing said first and second signals each other to extract synchronized clock signals; and an absolute value circuit outputting an absolute value of an output of said phase comparator means, wherein the means for providing a second signal by frequency dividing produces a divided frequency second signal wherein a falling edge of the divided frequency second signal should sometimes be detected for a correct phase error, and the absolute value circuit compensates for the phase comparison with the divided frequency second signal.

* * * * *

UNITED STATES PATENT AND TRADEMARK OFFICE
CERTIFICATE OF CORRECTION

PATENT NO.    : 6,154,511
DATED         : November 28, 2000
INVENTOR(S)   : S. Nakamura, et al.

It is certified that error appears in the above-identified patent and that said Letters Patent is hereby corrected as shown below:

Column 1,
Line 1, "invent ion" should read -- invention --

Column 4,
Line 65, "frequency divided" should read -- frequency-divided --

Claims,
Column 11, claim 7,
Line 34, "sometimes detected" should read -- sometimes be detected --

Signed and Sealed this

Twenty-third Day of October, 2001

*Attest:*

*Attesting Officer*

NICHOLAS P. GODICI
*Acting Director of the United States Patent and Trademark Office*